(12) United States Patent
Edamura et al.

(10) Patent No.: US 6,911,157 B2
(45) Date of Patent: Jun. 28, 2005

(54) PLASMA PROCESSING METHOD AND APPARATUS USING DYNAMIC SENSING OF A PLASMA ENVIRONMENT

(75) Inventors: Manabu Edamura, Chiyoda (JP); Hideyuki Yamamoto, Kudamatsu (JP); Kazuyuki Ikenaga, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/347,402

(22) Filed: Jan. 21, 2003

(65) Prior Publication Data

US 2003/0132195 A1 Jul. 17, 2003

Related U.S. Application Data

(62) Division of application No. 09/793,624, filed on Feb. 27, 2001.

(30) Foreign Application Priority Data

Sep. 12, 2000 (JP) .......................................... 2000-276668

(51) Int. Cl.[7] .............................................. H01L 21/00
(52) U.S. Cl. .............................. 216/59; 216/60; 216/67; 438/14; 438/16; 156/345.24; 156/345.25; 156/345.26
(58) Field of Search .............................. 216/59, 60, 67; 156/345.24, 345.25, 345.26, 345; 118/712; 438/14, 16

(56) References Cited

U.S. PATENT DOCUMENTS

| 4,985,114 A | * | 1/1991 | Okudaira et al. | .............. 216/37 |
| 5,405,488 A | * | 4/1995 | Dimitrelis et al. | ............. 216/60 |

FOREIGN PATENT DOCUMENTS

WO    WO 99/14699    *  3/1999    ........... G06F/19/00

* cited by examiner

*Primary Examiner*—Shamim Ahmed
(74) *Attorney, Agent, or Firm*—Antonelli, Terry, Stout & Kraus, LLP

(57) ABSTRACT

At least one control parameter such as power supplied to a plasma, process pressure, gas flow rate, and radio frequency bias power to a wafer is changed for an extremely short time as compared with an entire plasma processing time, to the extent that such a change does not affect the result of plasma processing on the wafer, to monitor a temporal change of a plasma state which occurs at the time of changing. A signal resulting from the monitoring method is used to control or diagnose the plasma processing, thereby making it possible to accomplish miniature etching works, high quality deposition, surface processing.

11 Claims, 4 Drawing Sheets

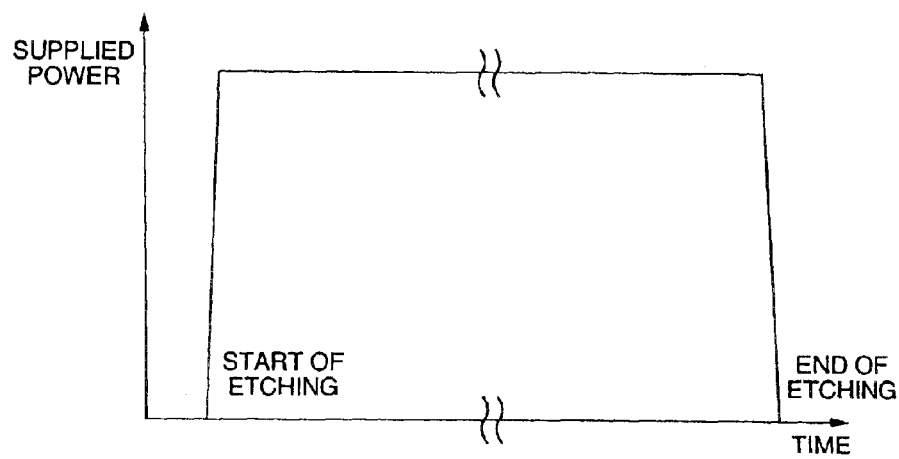
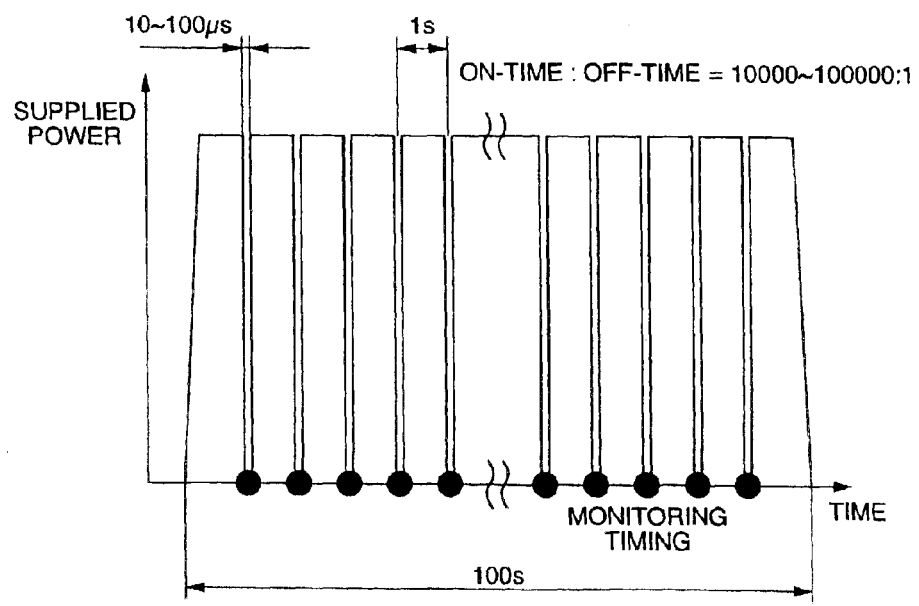

PLASMA PROCESSING METHOD AND APPARATUS USING DYNAMIC SENSING OF A PLASMA ENVIRONMENT

CROSS REFERENCE TO RELATED APPLICATION

This is a divisional of U.S. application Ser. No. 09/793,624, filed Feb. 27, 2001, the subject matter of which is incorporated by reference herein.

BACKGROUND OF THE INVENTION

The present invention relates to a plasma processing method and apparatus useful in the manufacturing of substrates for semiconductors devices, liquid crystal displays and so on, and more particularly, to apparatus process monitoring techniques useful for controlling process parameters associated with the plasma processing.

For supporting the trend of finer pattern sizes of semiconductor devices, the available scope of process conditions which provide for the realization of uniform processing results within a wafer, that is, a process window, has become narrower year by year in the plasma process. Future plasma processing apparatuses will be required to have the capabilities of more perfectly controlling the process state. The realization of the capabilities would involve an apparatus which is capable of extremely accurately controlling a distribution of a plasma, dissociation of a process gas, and surface reaction in a reactor.

For realizing such a highly accurate control for the plasma processing, some of recent plasma processing apparatuses are equipped with certain monitors for monitoring phenomena in the plasma processing to control the plasma processing using signals from the monitors. Taking a plasma etching apparatus as an example, the most common process monitor is a plasma emission spectrum monitor. For example, Japanese Patent No. 2666768 (JP-A-8-298259) issued on Jun. 27, 1997 discloses a method which relies on a signal generated by a plasma emission spectrum monitor to control a variety of parameters such as RF power, processing pressure, gas flow amount, and so on to manage an etching state. Also, most of currently commercially available plasma etching apparatuses perform an etching end-point determination for determining that etching has been completed using a change in the intensity of light emitted at a particular wavelength, the ratio of intensities of light emitted at a plurality of wavelengths, and so on. In addition, the usefulness of a variety of process monitors such as an impedance monitor for measuring an impedance of a load including a current, voltage and a plasma of a high frequency circuit for generating the plasma, a mass spectrometer, and so on has been investigated, other than the plasma emission spectrum monitor, for higher level plasma processing and management of associated apparatuses. Further, there is a process monitor based on absorption of laser or infrared light at a laboratory level, though it is seldom used in actual manufacturing lines.

SUMMARY OF THE INVENTION

While these process monitors are useful in a variety of aspects, the amount of information provided from these monitors is not sufficient since phenomena induced by a plasma within a process chamber is extremely complicated. For example, the plasma emission spectrum monitor encounters difficulties in determining, if light emitted by a plurality of dissociated species overlaps at the same wavelength, which of the dissociated species causes a change in the light. While this may be solved by mathmatical processing using a plurality of wavelengths, or the like, such a problem is not always solved by a good processing method in all cases.

At present, most of process monitors actually equipped in plasma processing apparatuses for use in semiconductor manufacturing lines are commonly based on passive monitors. As an active monitoring method, a method such as the aforementioned laser absorption method may be taken as an example. The laser absorption method provides an increased amount of information through an active operation which involves irradiating a laser. However, the laser absorption method is extremely difficult to implement in view of the cost, structural restrictions of associated apparatuses, and so on.

It is an object of the present invention to provide a plasma process monitoring method and apparatus for producing the result of actively monitoring control parameters without structural restrictions of the apparatus.

To implement the object, according to one aspect of the present invention, at least one plasma process control parameter such as power supplied to a plasma, process pressure, gas flow rate and high frequency bias power to a wafer is changed for an extremely short time as compared with an entire plasma processing time, to the extent that such a change does not affect the result of plasma processing on the wafer, to monitor a temporal change in a plasma state which occurs at the time of changing. By detecting a temporal change in the plasma state induced by an active action of changing the plasma state, information along a time axis is increased even using a process monitor identical to that used in the prior art, with the result that the amount of information included in the collected data is significantly increased.

Other objects, features and advantages of the present invention will become apparent from the following description of the embodiments taken in conjunction with the accompanying drawings.

BRIEF DESCRIPTION OF THE DRAWINGS

FIG. 2 is a schematic diagram showing a change in power supplied from a plasma source power supply in the plasma etching according to a prior art method;

FIG. 3 is a schematic diagram showing an operating method in the plasma etching according to one embodiment of the present invention;

DETAILED DESCRIPTION OF THE EMBODIMENTS

Embodiments of the present invention will hereinafter be described with reference to the accompanying drawings.

It should be first noted that the present invention is not limited to the field of semiconductor device manufacturing but may be applied to a variety of fields such as manufacturing of liquid crystal displays, a variety of plasma surface processing, and so on. In the following, embodiments will be described for a plasma etching apparatus for manufacturing semiconductor devices, taken as an example.

Figure 1:
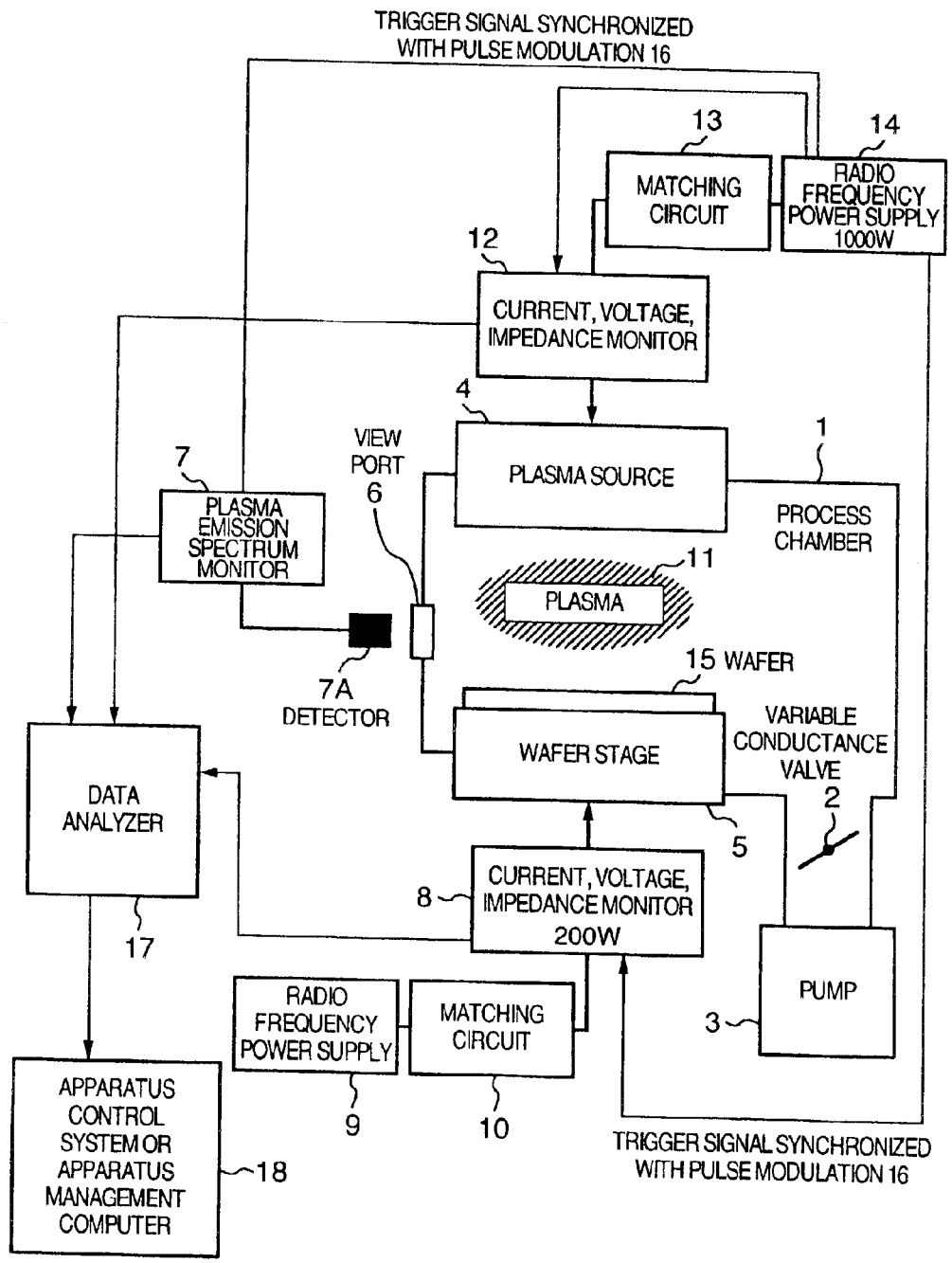
FIG. 1 is a block diagram illustrating an embodiment of the present invention.

FIG. 1 illustrates one embodiment of the present invention. A process chamber 1 in the figure is, for example, a vacuum chamber to which a pump 3 is connected through a variable conductance valve 2. In the process chamber 1, a wafer stage 5 is disposed for carrying a semiconductor wafer 15 which is applied with a high frequency by the wafer stage 5 to control ion energy impinging on the wafer 15. At a position opposite to the wafer 15, a plasma source 4 connected to a radio frequency (RF) power supply 14 via a current/voltage impedance monitor 12 and a matching circuit 13 is disposed for generating a plasma 11. The RF power supply 14, which is pulse modulated, can intermittently turn off the power to the plasma source 4. A trigger signal 16 synchronized with the pulse modulation is inputted to a plasma emission spectrum monitor 7 which includes a detector 7A for picking up light emitted from a plasma through a viewport 6, and to current/voltage impedance monitors 12, 8 disposed in a power supply line to the plasma source 4 and a bias line, respectively, so that these monitors are allowed to make measurements in synchronism with the timing of the pulse. The bias line includes the RF power supply 9 and a matching circuit 10, and is connected to the stage 5. Signals measured by these monitors are analyzed by a data analyzer 17 for their time response characteristics, fed back to an apparatus control system 18, and sent to a computer system 18 for managing respective semiconductor manufacturing apparatuses in the semiconductor factory, and so on as data, where the signals serve as a data source for diagnosis of the apparatuses. While this embodiment shows the plasma emission spectrum monitor and the current/voltage impedance monitors as examples of plasma process monitors, the present invention encompasses other monitoring means including optical, electrical, magnetic, mechanical, thermal, pressure, temperature, or other physical or chemical sensors.

FIG. 2 shows a change in the power supplied from the plasma source power supply during plasma etching in accordance with a prior art method. Generally, the power is maintained constant from the generation of a plasma to cut-off of the plasma after the end of the etching. FIG. 3 is a schematic diagram illustrating an operating method during plasma etching in accordance with one embodiment of the present invention. The power supplied to a plasma is pulsatively cut, for example, for a time width of 10–100 $\mu$s at intervals of one second. Assuming that an etching time roughly lasts for 10 seconds, approximately 100 off-times are included therein. The process monitors (sensors) for monitoring light emission and so on make measurements at timings in synchronism with the off times. When a cut time lasts for 10 $\mu$s, the ratio of an on-time and an off-time is 100,000. Alternatively, when the cut time lasts for 100 $\mu$s, the ratio is 10,000. Both ratios show sufficiently large values. It can therefore be said that the intermittently cut-off plasma will not substantially affect the result of etching on products.

Figure 4:
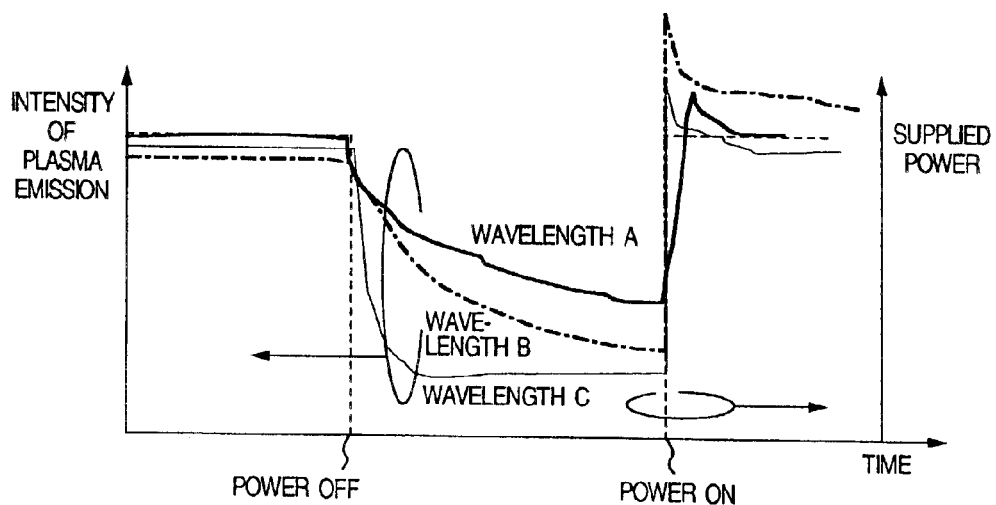
FIG. 4 is a schematic diagram showing a change in the intensity of emitted light during a power-off period.

FIG. 4 shows a waveform characteristic of a change in the intensity of light emitted by a plasma while the power supplied to the plasma is turned off. It can be seen from this characteristic that the profile of attenuation, i.e., attenuation pattern after power-off differs depending on the wavelength. Generally, with the off-time of such duration, the density of a dissociated species itself is not substantially reduced, so that the attenuation of the emitted light intensity after power-off corresponds to a reduction in the electron density and energy in the plasma. For example, light emitted from an atom attenuates rapidly since its excitation energy is high. However, light emitted from a molecule attenuates slowly due to its low excitation energy. It is therefore possible to identify a dissociated species by monitoring responses of these emitted light intensities. Also, the trend of lost electrons can also be revealed from these changes. When a process gas is not so electrically negative, the loss of electrons is largely dependent on the state of the wall surface of the chamber, so that the state of the wall surface of the chamber can be advantageously known from the loss of electrons.

Figure 5:
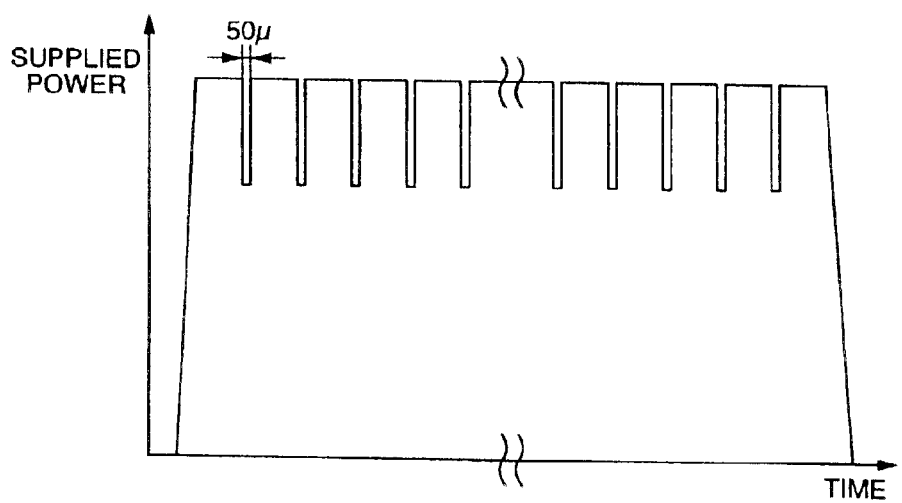
FIG. 5 is a schematic diagram showing an exemplary operating method according to one embodiment of the present invention.

FIG. 5 shows an exemplary operating method in accordance to one embodiment of the present invention. In some plasma generating methods, a generated plasma can increase its instability if the supplied power is completely shut off. As a solution to this problem, the supplied power is not completely shut off, but instead the power may be simply changed, as illustrated in FIG. 5, although this results in lower sensitivities of the process monitors. Similar effects are provided as well from this strategy. It should be noted that the power from the bias power supply may be changed instead of the power supplied from the plasma source power supply in FIGS. 3 and 5.

Figure 6:
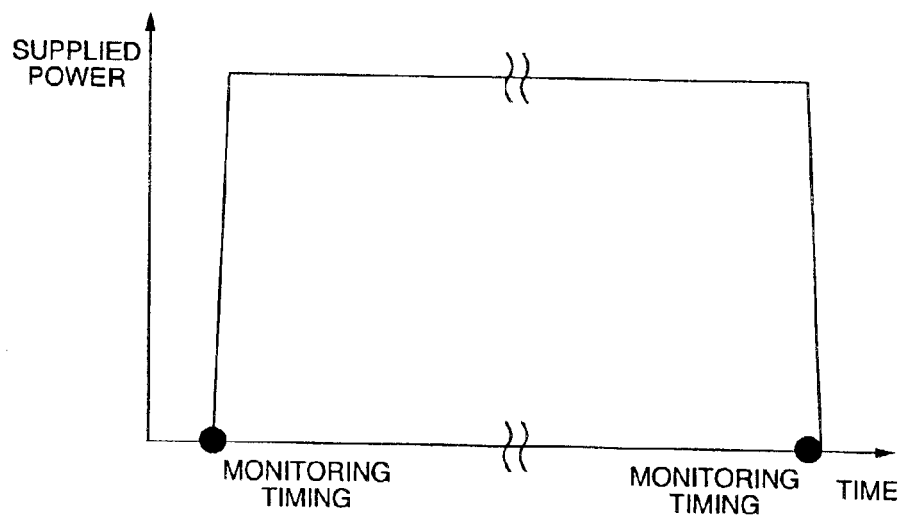
FIG. 6 is a schematic diagram showing a monitoring method according to one embodiment of the present invention.

In the conventional operating method, data collected by the process monitors when a plasma is lit and cut off may include a larger amount of information than data collected by the process monitors during a period in which a plasma is normally generated. FIG. 6 shows a monitoring method which makes use of this fact. Although this method is disadvantageous in that it can take data only at two points, the method can check the stability of a reactor, particularly, a surface state thereof due to light emitted at a timing at which a plasma is cut off and a change in a current and a voltage of the plasma source.

Figure 7:
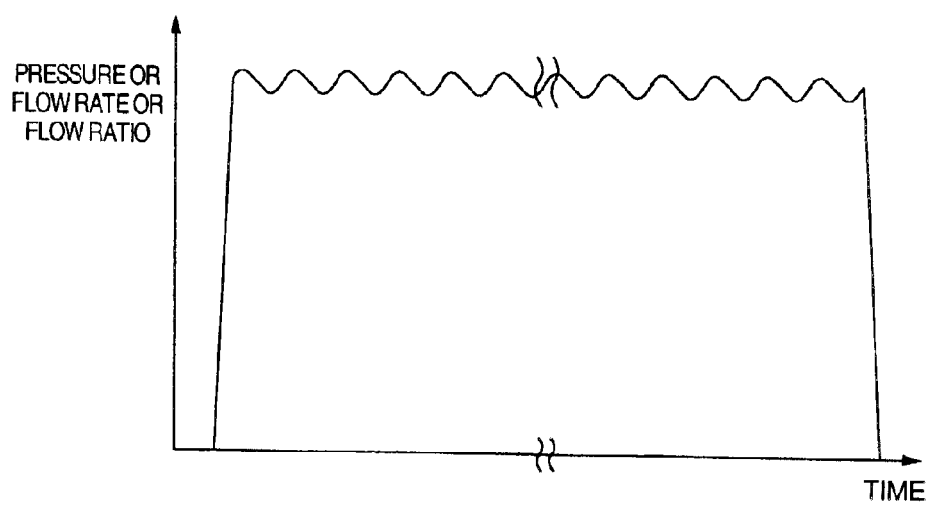
FIG. 7 is a schematic diagram showing a monitoring method according to another embodiment of the present invention.

FIG. 7 shows an embodiment of the present invention which is an example of varying a parameter such as pressure, flow rate, flow ratio or the like which exhibits a relatively slow response. In this event, since a short pulse such as the source power cannot be applied, an applied signal is oscillated to such an extent that the oscillated signal does not affect the result of etching. Then, a change in the amount of measurement caused by the oscillations is monitored by a process monitor, so that the state of a plasma in the reactor can be revealed at a higher sensitivity than the prior art method.

Next, a specific sensor output and an associated processing control method according to the present invention will be described for etching of an insulating film such as $SiO_2$, taken as an example. In an insulating film etching process, a $C_4F_8$ gas is added to a main Ar gas. The $C_4F_8$ gas is added to provide good etching and deposition performance. In the insulating film etching, it is known that the state of a chamber wall, on which polymer is deposited by the $C_4F_8$ gas, largely affects the plasma etching. For carrying out stable plasma etching for a large number of wafers, it is necessary to reveal the state of the chamber wall.

For this purpose, the operation monitoring method according to the embodiment shown in FIG. 6 is relied on to detect an Ar light emission attenuation curve at the time a plasma is cut off. The attenuation of light emission is mainly caused by extinction of electrons. When the plasma is cut off, electrons mainly collide against the chamber wall and extinguish, so that the attenuation curve is largely affected by the state of the wall. The data analyzer 17 in FIG. 1 performs fitting on the assumption that the intensity I of light emitted from Ar is defined by I=Io·exp(−kt), and determines a timing of starting the wafer processing or a timing of cleaning the chamber, based on whether or not the value of the coefficient k lies within a previously set proper range, and issues an instruction to the apparatus control system or the apparatus management computer 18. More specifically, the data analyzer 17 determines that the chamber needs aging, when k is large, because the chamber wall is too clean, and determines that the chamber wall is extremely contaminated and therefore needs cleaning when k is too small. An appropriate supporting action is taken for the chamber in accordance with the result of the determination.

As another specific example, in the insulating film etching, a $CF_2$ radical mainly drives forward the etching, so that this is the most important dissociated species. While light emitted from $CF_2$ radicals appears as a large number of peaks in an ultraviolet band of 200 to 300 nm, a high resolution spectrometer is required for detecting these peaks.

A high resolution spectrometer is large in size, whereas a spectrometer generally equipped in a manufacturing apparatus is small in size but has a low resolution incapable of identifying such peaks of $CF_2$ and distinguishing them from peaks of, for example, Si and so on which also appear in the same band. To overcome this problem, the operating method according to the embodiment of the present invention shown in FIG. 3 is relied on to detect an attenuation curve representative of overlapping light emitted from $CF_2$ and Si, and light emitted from an atom which can be independently measured, such as peaks of Ar, as a reference, using the plasma emission spectrum monitor 7. As described above, light emitted from an atom attenuates faster than light emitted from a molecule, so that the data analyzer 17 can analyze a contribution of $CF_2$ to the amount of emitted light from these attenuation curves. Then, the data analyzer 17 issues an instruction to the control system 18 to control the flow rate of $C_4F_8$, by way of example, such that the amount of $CF_2$ resulting from the analysis remains constant. As a result, a dissociated state of $CF_2$ is maintained constant, thereby making it possible to keep favorable results of etching for a multiplicity of wafers.

As described above, according to the present invention, a control parameter such as power supplied to a plasma, process pressure, gas flow rate, high frequency bias power to a wafer, or the like is changed for an extremely short time as compared with an entire plasma processing time to the extent that such a change does not affect the result of plasma processing on a wafer to monitor a temporal change in a plasma state which may occur during the short time, thereby increasing the amount to information along a time axis even using a process monitor identical to that used in the prior art, with the result that the amount of information included in the collected data is significantly increased. By controlling the plasma processing using signals generated by this method, it is possible to accomplish good etching of wafers with finer patterns, high quality deposition, surface processing and so on.

What is claimed is:

1. A plasma processing method comprising the steps of:
changing at least one parameter for controlling a process utilizing a plasma processing apparatus to the extent that the change does not substantially affect the result of plasma processing on a wafer, said at least one parameter being selected from a group including power supplied to a plasma, a process pressure, a gas flow rate, and radio frequency bias power to the wafer;

detecting attenuation patterns of plasma emission intensities of a plurality of wavelengths as a plasma emission signal which occurs in a plasma state in response to the changing of said at (east one parameter at a monitoring timing and providing an output indicative thereof;

determining a response characteristic of the detected plasma emission signal for each monitoring timing and providing an output signal thereof; and performing a control of plasma processing and/or diagnosis of said plasma processing apparatus using said output signal.

2. A plasma processing method comprising the steps of:
operating a plasma processing apparatus while intermittently cutting off the power supplied to the plasma;

detecting a signal representative of attenuation patterns of plasma emission intensities of a plurality of wavelengths in a plasma state immediately after the power is cut off, using optical monitoring means; and performing a control of plasma processing and/or diagnosis of said plasma processing apparatus using said detected signal.

3. A plasma processing method comprising the steps of:
triggering a change of at least one parameter for controlling a process for a substantially shorter time than an entire plasma processing time of a plasma processing apparatus to the extent that the change does not substantially affect the result of plasma processing on a wafer, said at least one parameter being selected from a group including power supplied to a plasma, a process pressure, a gas flow rate, and radio frequency bias power to the wafer;

detecting attenuation patterns of plasma emission intensities of a plurality of wavelengths as a signal in a plasma light emission state which occurs in response to execution of said step of triggering at a monitoring timing associated with the parameter changing and providing an output indicative thereof;

determining in response to the output a response characteristic pattern of the detected plasma emission signal for each monitoring timing, and providing an output signal indicative of the determined characteristic pattern;

analyzing the plasma state or a process state utilizing a temporal change in plasma light emission based on the output signal; and performing a control of plasma processing and/or diagnosis of said plasma processing apparatus using data representative of a result of the analysis.

4. A plasma processing method according to claim 1, wherein
said step of changing includes operating said plasma processing apparatus while intermittently cutting off the power supplied to the plasma or the radio frequency bias, as said parameter, to said wafer in repetition, a period of the intermittent cutting off representing the monitoring timing; and said step of detecting includes detection of the plasma emission signal indicative of a temporal change in the plasma state immediately after the power or the bias is cut off.

5. A plasma processing method according to claim 1, wherein each monitoring timing occurs at a predetermined timing.

6. A plasma processing method according to claim 1, wherein the changing of the at least one parameter includes one of lowering and cutting off the power supplied to the plasma for a period not greater than 100 μs.

7. A plasma processing method according to claim 6, wherein the period is in a range of 10 μs to 100 μs.

8. A plasma processing method according to claim 2, wherein the power supplied to the plasma is cut off for a period not greater than 100 μs without substantially affecting plasma processing of an object to be processed by the plasma processing apparatus.

9. A plasma processing method according to claim 8, wherein the period is in a range of 10 μs to 100 μs.

10. A plasma processing method according to claim 3, wherein the changing of the at least one parameter includes one of lowering and cutting off the power supplied to the plasma for a period not greater than 100 μs.

11. A plasma processing method according to claim 10, wherein the period is in a range of 10 μs to 100 μs.

* * * * *